United States Patent
Yoder

(10) Patent No.: US 9,684,873 B2
(45) Date of Patent: *Jun. 20, 2017

(54) LOGIC CIRCUITS WITH AND-NOT GATE FOR FAST FUZZY DECODERS

(71) Applicant: Lane Yoder, Kaneohe, HI (US)

(72) Inventor: Lane Yoder, Kaneohe, HI (US)

( * ) Notice: Subject to any disclaimer, the term of this patent is extended or adjusted under 35 U.S.C. 154(b) by 417 days.

This patent is subject to a terminal disclaimer.

(21) Appl. No.: 14/173,006

(22) Filed: Feb. 5, 2014

(65) Prior Publication Data

US 2014/0156563 A1   Jun. 5, 2014

Related U.S. Application Data

(63) Continuation-in-part of application No. 12/968,154, filed on Dec. 14, 2010, now Pat. No. 8,655,797.

(51) Int. Cl.
| | | |
|---|---|---|
| *G06N 5/00* | (2006.01) | |
| *G06F 1/00* | (2006.01) | |
| *G06N 7/04* | (2006.01) | |
| *G06N 3/04* | (2006.01) | |
| *G06N 3/063* | (2006.01) | |
| *G11C 8/10* | (2006.01) | |

(52) U.S. Cl.
CPC ........... *G06N 7/046* (2013.01); *G06N 3/0436* (2013.01); *G06N 3/063* (2013.01); *G11C 8/10* (2013.01)

(58) Field of Classification Search
CPC ............ G06N 5/04; G06N 5/02; G06N 5/022
See application file for complete search history.

(56) References Cited

U.S. PATENT DOCUMENTS

| | | | | |
|---|---|---|---|---|
| 6,165,131 A | * | 12/2000 | Cuce' ..................... | A61B 5/022 128/920 |
| 2008/0185057 A1 | * | 8/2008 | Prakash et al. ..... | F16K 99/0001 137/594 |

OTHER PUBLICATIONS

Meng, A hybrid fuzzy neural decoder for convolution codes, 1998.*

* cited by examiner

*Primary Examiner* — Stanley K Hill
*Assistant Examiner* — Kalpana Bharadwaj
(74) *Attorney, Agent, or Firm* — Leighton K. Chong

(57) ABSTRACT

A logic decoder circuit capable of performing Boolean or fuzzy logic has one or more logic components configured to perform a logic function of an AND-NOT gate, each AND-NOT gate comprising a circuit that performs a conjunction of an excitatory input X and an inhibitory input Y to obtain an output X-AND-NOT-Y substantially linearly for given ranges for X and Y. Certain preferred designs are provided for an X-AND-NOT-Y logic gate and a family of fast fuzzy decoders composed of such gates.

19 Claims, 20 Drawing Sheets

LOGIC CIRCUITS WITH AND-NOT GATE FOR FAST FUZZY DECODERS

This U.S. patent application is a continuation-in-part of and claims the priority filing date of U.S. patent application Ser. No. 12/968,154, filed on Dec. 14, 2010, entitled "Systems and Methods for Brain-Like Information Processing", by the same inventor in the present application, and which is incorporated in its entirety by reference herein.

BACKGROUND OF INVENTION

The relationship between the organization of synaptic connections and how the brain processes information has traditionally been poorly understood. For some reflex responses the connectivity has been discovered by direct observation, and some theoretical networks have been proposed to explain other simple neural responses. Deriving a neural network's behavior requires some assumptions about the behavior of the network's components. Many models have been proposed for neuron responses, most of which fall into one of two categories. One is the pulse model, such as the model of McCulloch and Pitts (A logical calculus of the ideas immanent in nervous activity. Bulletin of Mathematical Biophysics 5: 115-133 (1943)) and the "integrate-and-fire" model. The second is the firing rate model, such as that proposed by Hopfield (Neurons with graded response have collective computational properties like those of two-state neurons. Proceedings of the National Academy of Sciences 81: 3088-3092. (1984)). However, a general problem with traditional models is that it is uncertain whether the assumptions hold for real neurons. The more detailed the assumptions are, the greater the uncertainty.

To take just one example, a standard model for neuron response assumes that activation is a nonlinear function of a weighted sum of the inputs. This function may appear to be fairly general, but it cannot express quite simple functions of two or more variables or even produce reasonable approximations of them. For example, a possible neuron response to excitatory inputs X and Y is $R[S(X)+S(Y)]$, where S is a sigmoid function that amplifies large inputs and reduces small ones, and R restricts outputs asymptotically below some physical bound on a neuron's maximum response. Because of the nonlinearity of S, $S(X)+S(Y)$ cannot be expressed as a weighted sum of X and Y. This implies the response function $R[S(X)+S(Y)]$ cannot be expressed as a nonlinear function of a weighted sum of X and Y.

In my prior U.S. patent application Ser. No. 12/968,154, filed on Dec. 14, 2010, entitled "Systems and Methods for Brain-Like Information Processing", I disclosed embodiments of networks to simulate the functions of neural networks of the brain in the form of formal logic circuits that can discriminate degrees of state, and combinations of degrees of state, of any number of neurons. In one embodiment, I disclosed a logic circuit comprising Recursive AND NOT Conjunctions (RANCs), comprised from two or more AND NOT gates. A RANC is a general logic circuit that performs conjunctions for $2^n$ possible combinations of truth values of n propositions. The RANCs function dynamically, with capabilities of excitation and inhibition. Networks of RANCs are capable of subserving a variety of brain functions, including creative and analytical thought processes. A complete n-RANC produces all conjunctions corresponding to the $2^n$ possible combinations of truth values of n propositions. It is therefore desirable to provide highly effective and accurate logic circuits to perform the RANC function in as optimal a manner as possible.

SUMMARY OF INVENTION

In the present invention, a logic decoder circuit capable of performing Boolean or fuzzy logic comprises one or more logic components configured to perform a logic function of an AND-NOT gate, each AND-NOT gate comprising a circuit that performs a conjunction of an excitatory input X and an inhibitory input Y to obtain an output X-AND-NOT-Y substantially linearly for given ranges for X and Y.

Certain preferred designs are provided for an X-AND-NOT-Y logic gate and a family of decoders composed of such gates that can perform the AND-NOT function in a highly effective and accurate manner. The preferred designs for an AND-NOT gate emulate the basic capabilities of a neuron, so that fuzzy logic decoders composed of such AND-NOT gates can closely emulate the brain's method of processing information. Such an AND-NOT gate and the availability of an input of logical 1 from the power supply make up a functionally complete set, and can be constructed in a simple design version with a single transistor and resistor. As few as four transistors can be used to produce an ideal, linear form of a neuron's fuzzy logic. In an exemplary embodiment, the AND-NOT gate employs two operational amplifiers, one of which is configured as a voltage subtractor that does not depend on a differential pair. A modular and recursively defined organization of connections among AND-NOT gates can be used to form efficient fuzzy logic decoders. If the AND-NOT gates are fuzzy, the decoders can generate an especially powerful form of fuzzy logic.

Other objects, features, and advantages of the present invention will be explained in the following detailed description of the invention having reference to the appended drawings.

DESCRIPTION OF PREFERRED EMBODIMENTS

Figure 1A:
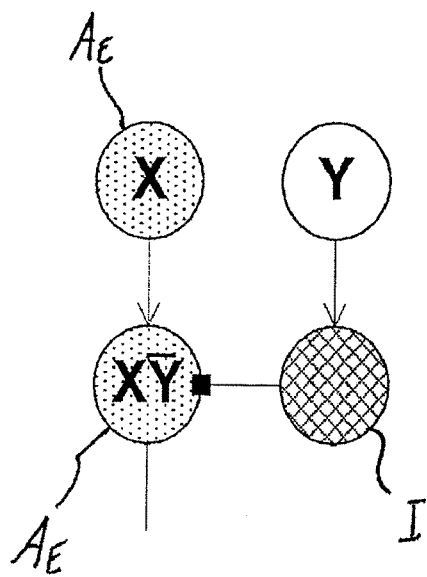
FIGS. 1A, 1B, 1C, and 1D are schematic diagrams illustrating neurons as logic gates that receive excitatory and inhibitory inputs and provide a logical output.
Figure 1B:
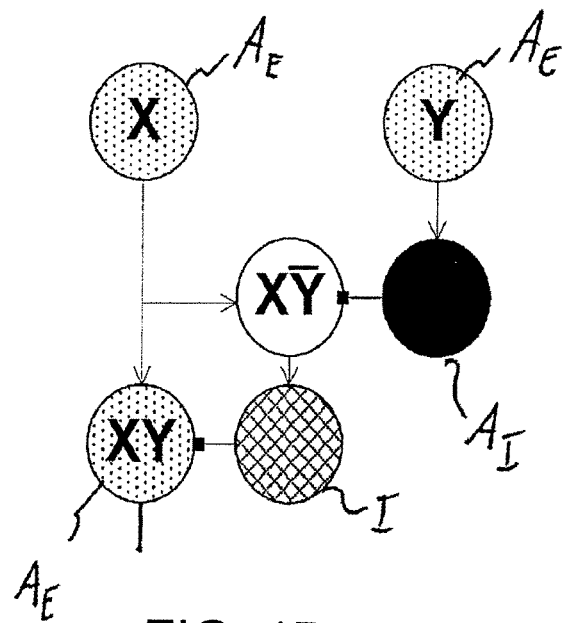
Figure 1C:
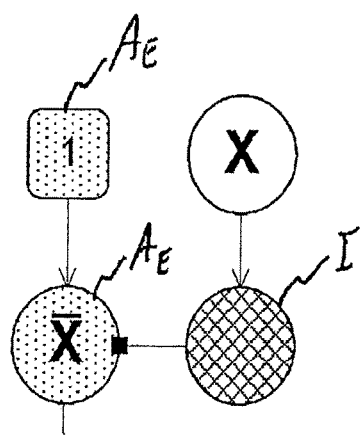
Figure 1D:
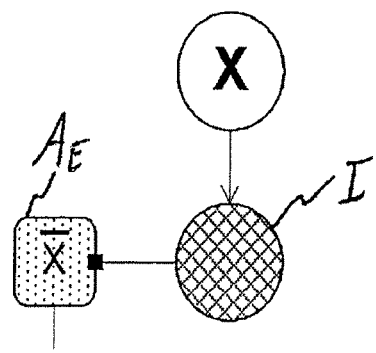

In the following detailed description of the invention, certain preferred embodiments are illustrated providing certain specific details of their implementation. However, it will be recognized by one skilled in the art that many other variations and modifications may be made given the disclosed principles of the invention.

The disclosure in my prior U.S. patent application Ser. No. 12/968,154, filed on Dec. 14, 2010, entitled "Systems and Methods for Brain-Like Information Processing", is incorporated in its entirety by reference herein for a background explanation of the use of logic networks to simulate the functions of neural networks of the brain.

FIGS. 1A, 1B, 1C, and 1D are schematic diagrams illustrating neurons as logic gates that receive excitatory and inhibitory inputs and provide a logical output. The label on each neuron represents its response. The maximum and minimum possible responses 1 and 0 can stand for the logical values true and false, making the network outputs logical functions of the inputs. The diagrams show logic gates for X-AND-NOT-Y in FIG. 1A, X-AND-Y in FIG. 1B, and NOT-X with fixed and analog inputs in FIG. 1C and FIG. 1D, respectively. Arrows indicate excitatory input; blocks indicate inhibitory input. Spontaneously active neurons are depicted by a square. To illustrate example inputs and outputs, active neurons are designated with an '$A_E$'. Inactive inhibitory cells are designated with an 'I'. As illustrated in the diagram in FIG. 1A, the logical conjunction X and Y via the X-AND-NOT-Y logic circuit has the same truth values, indicating that a physical neuron performs similarly to the logical AND-NOT function. A neuron-simulating logic circuit with one excitatory input and one inhibitory input performing a logical AND-NOT function will be called a neural AND-NOT gate. Cells that provide input to the networks are not considered part of the networks.

An AND gate and a NOT gate are logical primitives that together make up a "functionally complete" set for a neural AND-NOT gate. Functionally complete components are especially significant when they are available in large numbers, and the abundance of neurons is the main distinguishing feature of the human brain. Given any function that can be executed by a computer, for example, and given enough functionally complete components, there is a way to construct a logic circuit that performs the function. This also applies to any set of functions that any number of computers could conceivably perform, with parallel or sequential processing, including everything computer software could possibly do because any software can be implemented in hardware and vice-versa.

In the preferred logic circuit designs in the present invention, the AND-NOT gate may be configured with a voltage subtractor, and a family of decoders is composed of the preferred voltage subtractors. The subtractor is significantly simpler than existing subtractors and is capable of subtracting voltages across the entire range of voltages normally used in logic circuits. The decoders can generate neural correlates of familiar phenomena central to color vision and olfaction, such as color mixing, mutually exclusive colors, and color space. The improved decoders herein are more efficient than standard decoder architectures, even for digital logic using digital logic components. With subtractors as components, the decoders produce a particularly powerful and efficient form of fuzzy logic.

A neuron fires when its excitatory input outweighs its inhibitory input. If the excitatory input X and inhibitory input Y are large or small, the output is the logic value of an X-AND-NOT-Y gate. There are many ways to extend Boolean logic functions to fuzzy logic. A particularly useful definition for the fuzzy truth value of X-AND-NOT-Y is the difference of the component truth values if X is greater than Y, and 0 otherwise. More generally, the difference can be replaced by a measure of the difference (defined below), which still produces useful fuzzy logic. This value roughly matches a neuron's nonlinear output and can take advantage of transistors' nonlinear properties.

By extension, for truth values X1, X2, . . . , Xn and Y1, Y2, . . . , Ym, the truth value of X1 AND . . . AND Xn AND-NOT Y1 AND . . . AND-NOT Ym can be defined as any measure of the difference between min{Xi} and max{Yj} if min{Xi}>max{Yj}, and 0 otherwise. The intuitive rationale for this definition is that the proposition should have a high truth value if and only if all of the Xi have high truth values and all of the Yj have low truth values. This definition forms the basis of Fast Fuzzy Decoders. Certain Boolean logic identities allow FFDs to achieve this fuzzy output with a simple and recursive architecture.

Fuzzy logic is not automatically powerful or even useful. In implementing fuzzy logic, at least three choices must be made concerning the logic involved:

1. Which logical primitives make up the functionally complete component set? If the logic is to be implemented in electronic hardware, for example, the standard NAND and NOR gates commonly used for Boolean logic may not be the best choices for fuzzy logic.

2. How is the Boolean truth function of each logical primitive extended to a fuzzy logic truth function? The function should agree with Boolean logic for inputs of 0 and 1, but infinitely many continuous functions produce this output for inputs over the real-valued domain [0, 1]. The simplest or most common truth function will not necessarily lead to useful fuzzy logic.

3. Which logic identities are used in composing the logic circuits? For any given Boolean logic function, a logic circuit can be constructed from logical primitives in more than one way according to different Boolean logic identities. While the choice of logic identity will not affect the Boolean logic generated by the circuit, different logic identities may result in different fuzzy logic functions. Again, any particular choice does not necessarily result in useful fuzzy logic.

Two simple examples are given here to illustrate the problems that can arise. A common fuzzy truth value for the AND connective is the product of the component truth values. If the component values are all high, for most applications the truth value of the conjunction should also be high. But the product can be arbitrarily small if the truth values of sufficiently many components are less than 1.

The next example shows how a simple and obvious choice of a logic identity can produce undesirable fuzzy logic. One possible fuzzy truth function for X AND-NOT Y is max{0, X−Y}. The proposition X1 AND NOT X2 AND NOT ... AND NOT Xn can be implemented by successive application of the X AND-NOT Y function to an obvious association of the components that is equivalent to the proposition in Boolean logic: ((... (X1 AND-NOT X2) AND-NOT X3) ... AND-NOT Xn). Now suppose X1 is large and the other Xi are small but some are positive. With sufficiently many subtractions of small positive numbers, the result can be 0. But for some, if not all, applications, the truth value of the compound statement should be high if the first component is true or nearly true and the others are nearly false.

As a practical matter, the necessity of these choices means that simply substituting fuzzy logic components into existing architectures that were designed for classical logic will not always result in functional fuzzy logic circuits. The type of components, their particular outputs as functions of the inputs, and the connectivity of the components must all be carefully chosen. Not surprisingly, the brain's design accomplishes that.

Preferred Logic Circuit Designs for AND-NOT Gate

A Boolean "AND-NOT" gate has two inputs, X and Y, and one output, X-AND-NOT-Y. A Boolean AND-NOT gate together with the availability of an input of logical 1 from the power supply therefore can make up a functionally complete set.

Fast Fuzzy Decoders can be functionally composed of fuzzy AND-NOT gates. Each gate has two inputs, X and Y, and one output that represents the fuzzy truth value of X-AND-NOT-Y. This truth value is a measure of the difference X−Y, also called a measure of the interval [Y, X]. This interval measure is a simple generalization of interval length, defined by:

a) The measure of [0, 1] is 1;
b) The measure of [Y, X] is 0 if X≤Y; and
c) If X≥Y, the measure of [Y, X] is an increasing function of X and a decreasing function of Y.

The apparently simple measure defined by the properties a, b, and c above is subtly powerful. It allows circuits composed of the gates to identify maximum and minimum values, which is not possible with arithmetic operations. An FFD's outputs are therefore measures of intervals determined by maxima and minima of subsets of the inputs.

Figure 1E:
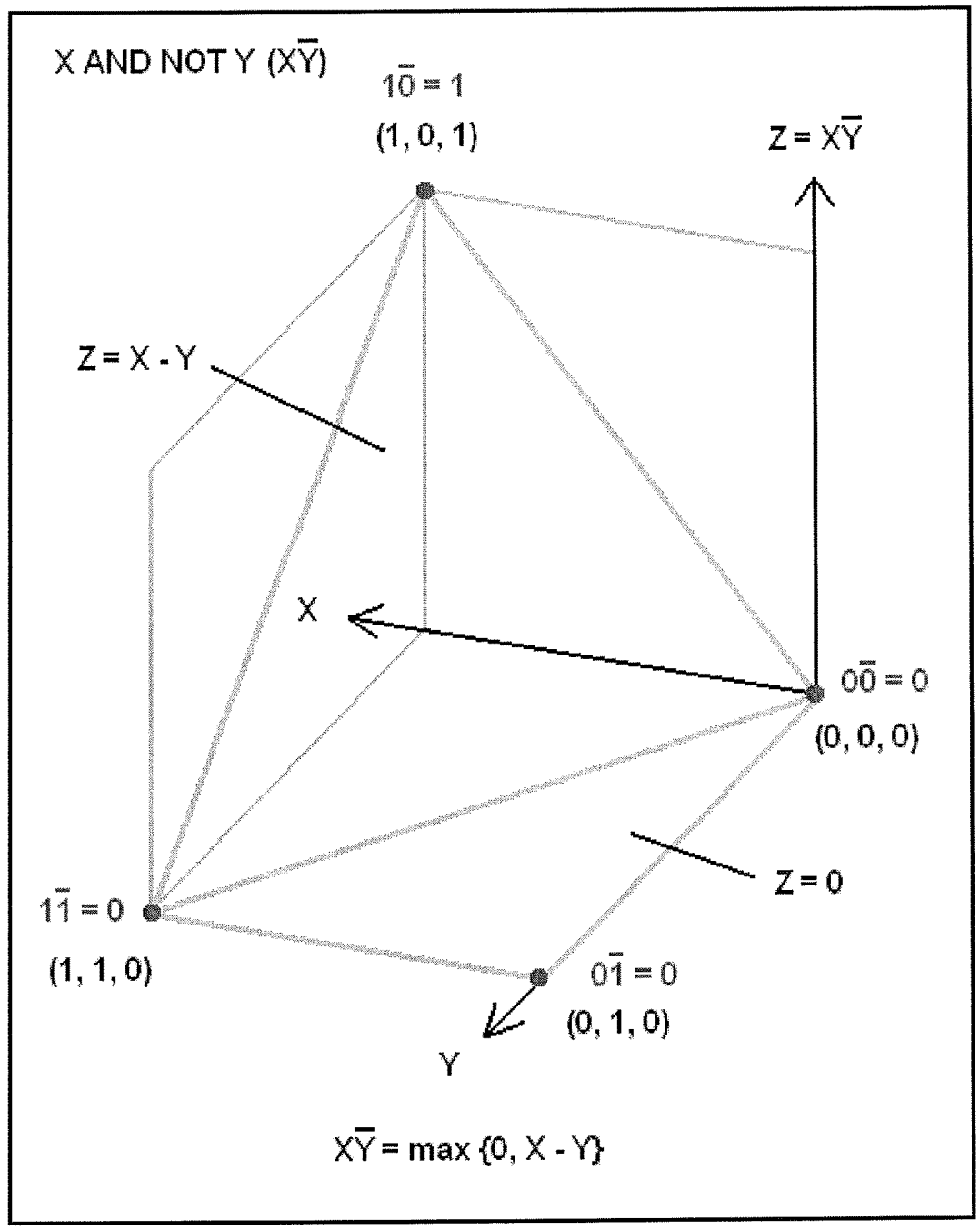
FIG. 1E is a topographic graph of the linear AND-NOT function.

If X and Y have binary values of 0 or 1, properties a and b imply that the measure of [Y, X] is the Boolean truth value of X-AND-NOT-Y. This in turn implies that if the measure is a linear function of X and Y when X≥Y, the measure is the interval length, i.e., max{0, X−Y}. A topographic graph of this piecewise linear function is illustrated in FIG. 1E, showing the linear fuzzy value of X-AND-NOT-Y is max{0, X−Y}. The function will be referred to as the linear AND-NOT function. The linear AND-NOT gates may have broad applications in addition to fuzzy logic. For example, a linear AND-NOT gate with the Y input grounded can be used as a half-wave rectifier.

The fuzzy truth value of X-AND-NOT-Y is defined herein to be a measure of the interval [Y, X], rather than simply the interval length, to allow for the possibility of taking advantage of transistors' nonlinear analog characteristics. Linearity is not necessary in producing useful fuzzy logic, although a highly nonlinear function may not be useful over parts of its domain. Linearity, or an output somewhat close to linear, seems to be desirable for useful logic over the whole domain.

Other commonly used fuzzy truth functions for X-AND-NOT-Y that depend on common truth functions for components AND and NOT, such as X(1−Y) or min{X, 1−Y}, are not chosen here because of the kinds of problems mentioned above and because the interval measure definition, with the right circuit architecture, results in a powerful and efficient form of fuzzy logic that emulates the processing of information in the brain.

FIGS. 2-11 show preferred design implementations of AND-NOT gates to obtain the above-described AND-NOT function. FIGS. 6-11 show preferred design implementations to obtain the linear AND-NOT function.

Figure 2A:
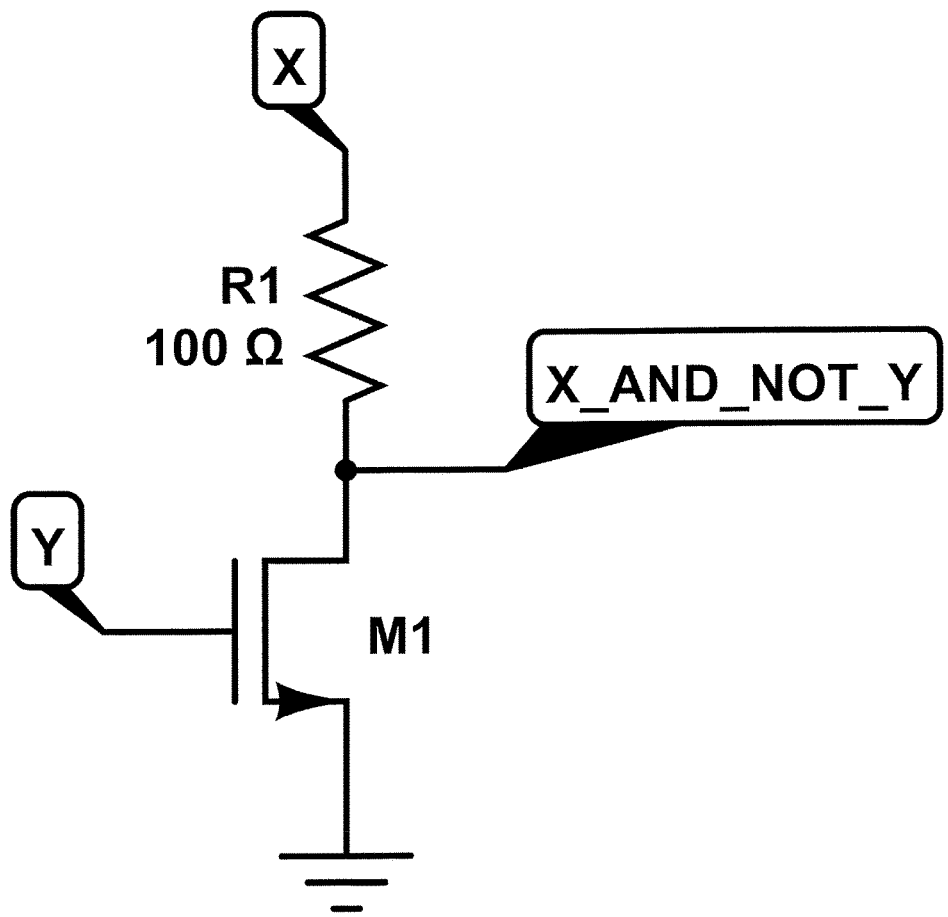
FIGS. 2A and 2B are circuit diagrams for preferred minimal AND-NOT gates.
Figure 2B:
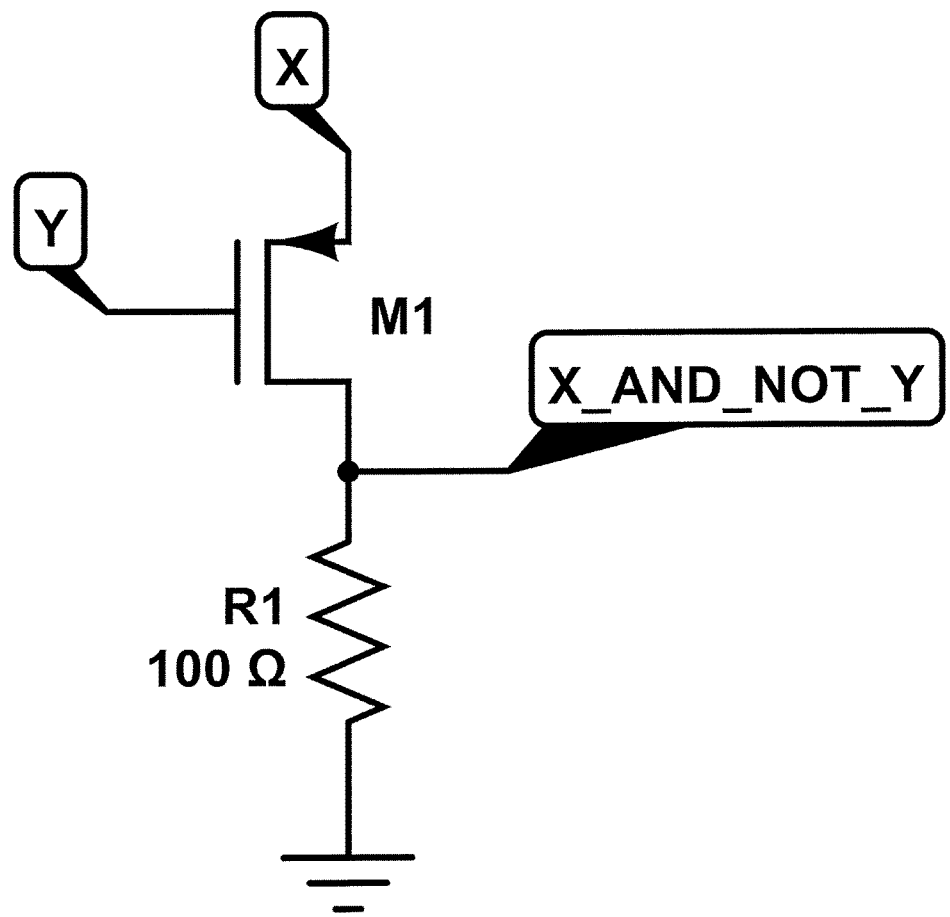

FIGS. 2A and 2B show preferred minimal AND-NOT gates that can be constructed with minimal hardware, possibly less hardware than any other functionally complete gate that may be designed. For example, the design in FIG. 2A has an X input applied to a high end of resistor R1, a Y input applied to a gate of N-channel transistor M1 having its source connected in series with the resistor R1 and its drain to ground, and the output X-AND-NOT-Y provided at the connection between resistor R1 and transistor M1. The design in FIG. 2B has an X input applied to a source of a P-channel transistor M1, a Y input applied to a gate of the transistor M1, the drain of the transistor M1 connected in series through the resistor R1 to ground, and the output X-AND-NOT-Y provided at the connection between resistor R1 and transistor M1.

Figure 3:
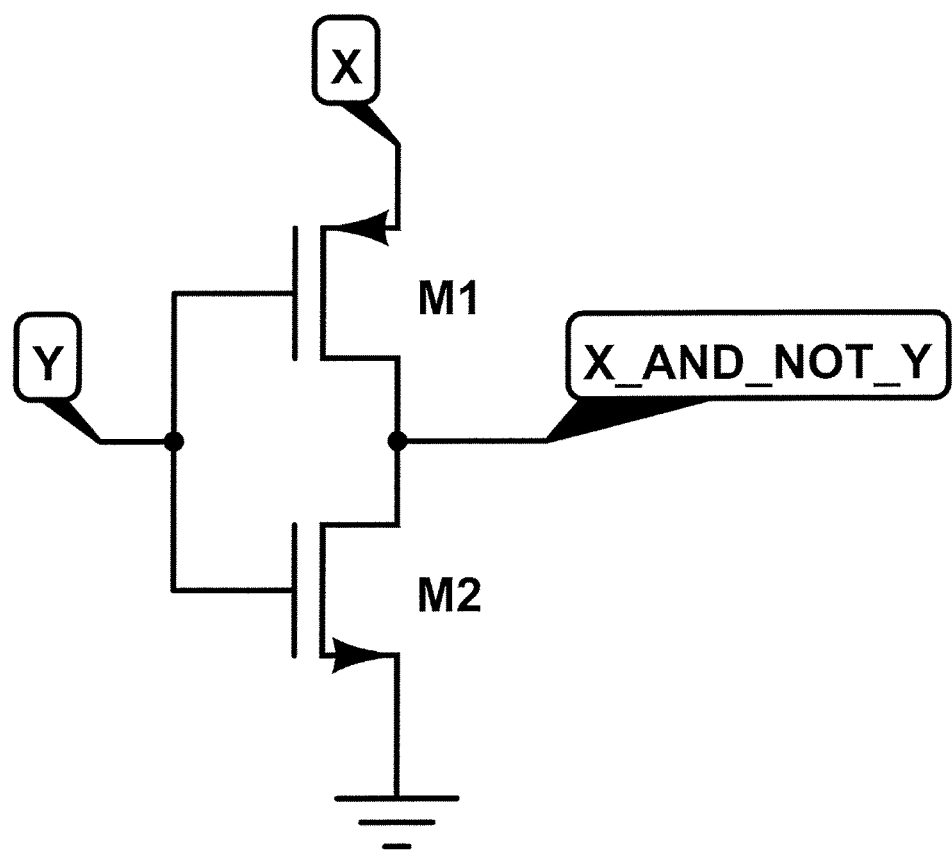
FIG. 3 is a circuit diagram for a preferred AND-NOT gate using two transistors.

The two-transistor design in FIG. 3 has an X input applied to a source of a first P-channel transistor M1 connected to a second N-channel transistor M2 to ground, a Y input applied in parallel to the gates of both transistors, and the output X-AND-NOT-Y provided at the connection between transistors M1 and M2.

Figure 4:
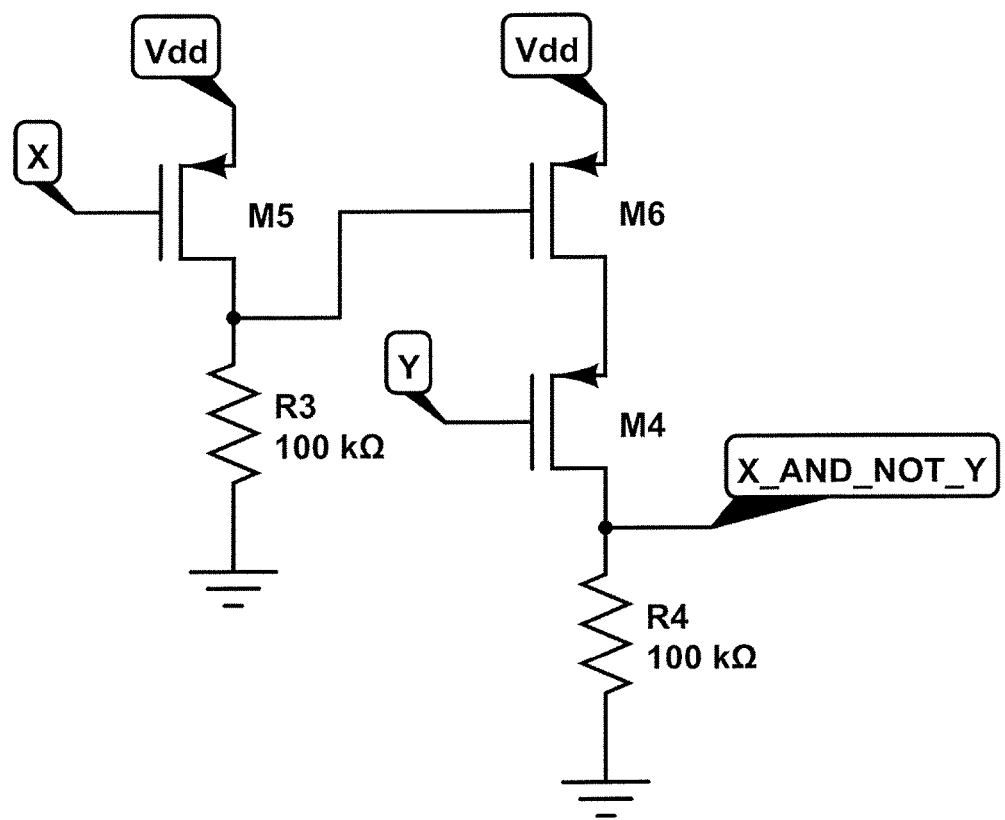
FIG. 4 is a circuit diagram for a preferred AND-NOT gate with transistors in two stages.

The two-stage design in FIG. 4 has an X input applied to a gate of a P-channel transistor M5 in a first stage connected in series with a resistor R3 to ground and biased by bias voltage Vdd, the first stage output connected to a gate of a P-channel transistor M6 in a second stage connected in series with a P-channel transistor M4 and biased by bias voltage Vdd, a Y input applied to a gate of the transistor M4, the drain of the transistor M4 connected in series through the resistor R4 to ground, and the output X-AND-NOT-Y provided at the connection between resistor R4 and transistor M4. The outputs of the first three designs are bounded by X. The last design is highly nonlinear, with a high output when X and Y are only close to logical 1 and 0. High resistance can limit the static current to 50 microamps.

Figure 5:
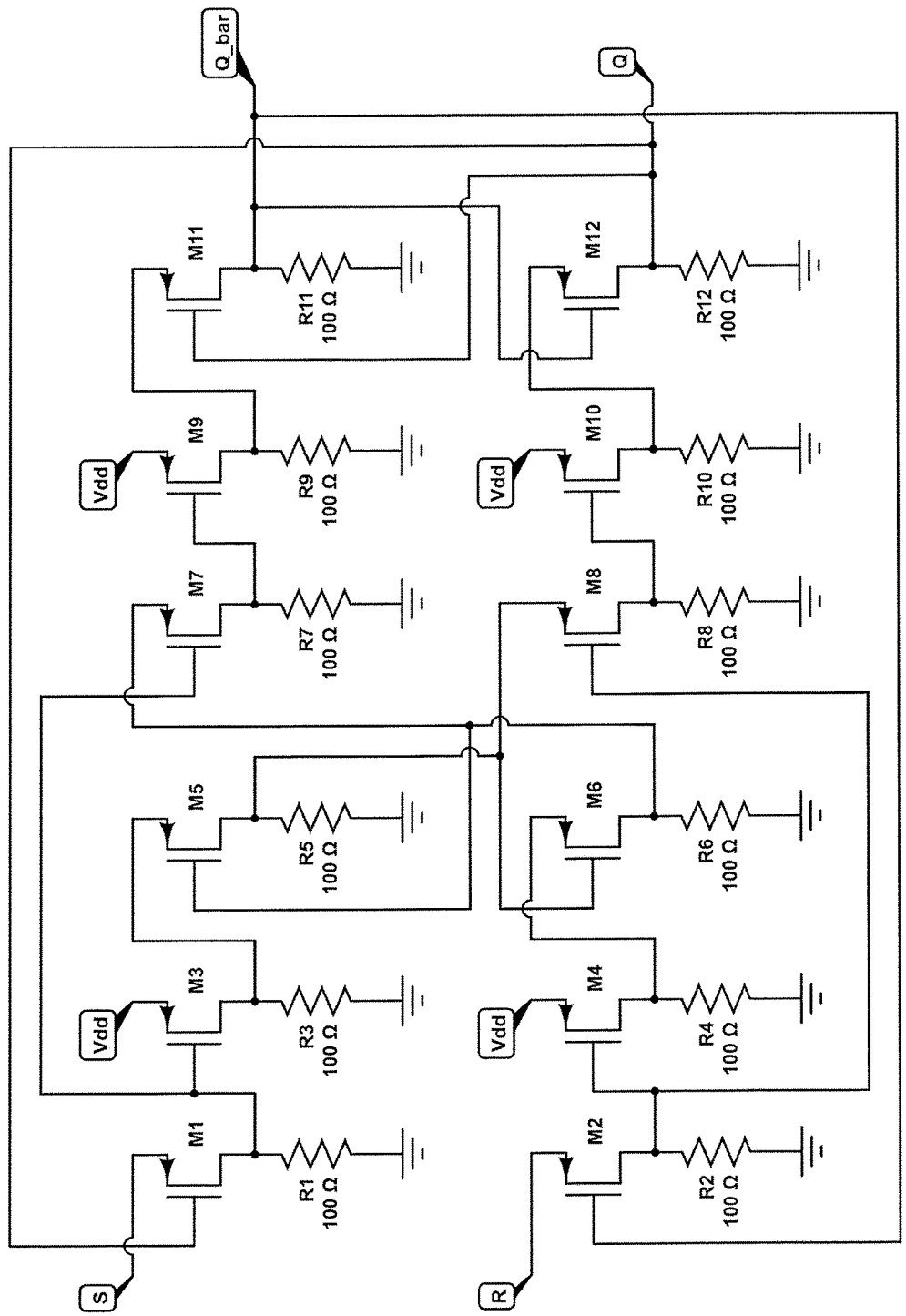
FIG. 5 is a circuit diagram of AND-NOT gates used in a master-slave flip flop circuit.

FIG. 5 is a circuit diagram of AND-NOT gates used in a master-slave flip flop circuit. This circuit is composed of 12 identical AND-NOT gates. A standard master-slave with eight four-transistor NAND gates has 32 transistors. Although constructed with minimal components, this flip flop design is more robust than it might appear.

Figure 6:
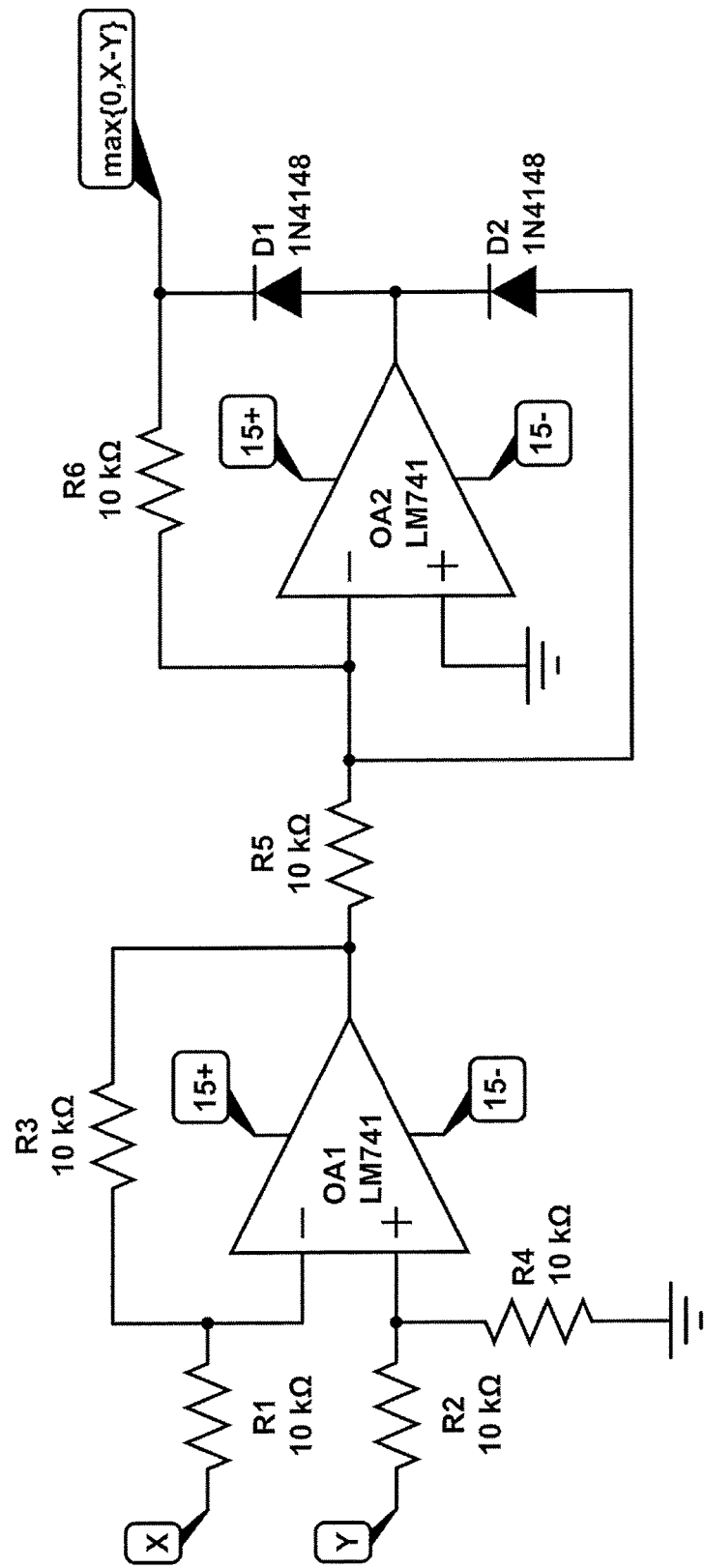
FIG. 6 is a circuit diagram for a preferred linear AND-NOT gate with two op amps.

FIG. 6 is a circuit diagram for a preferred linear AND-NOT gate with two op amps. A linear AND-NOT gate can be accomplished with one op amp configured as a subtractor and a second op amp as a half-wave rectifier. The output is within 1 mV of linear.

Figure 7:
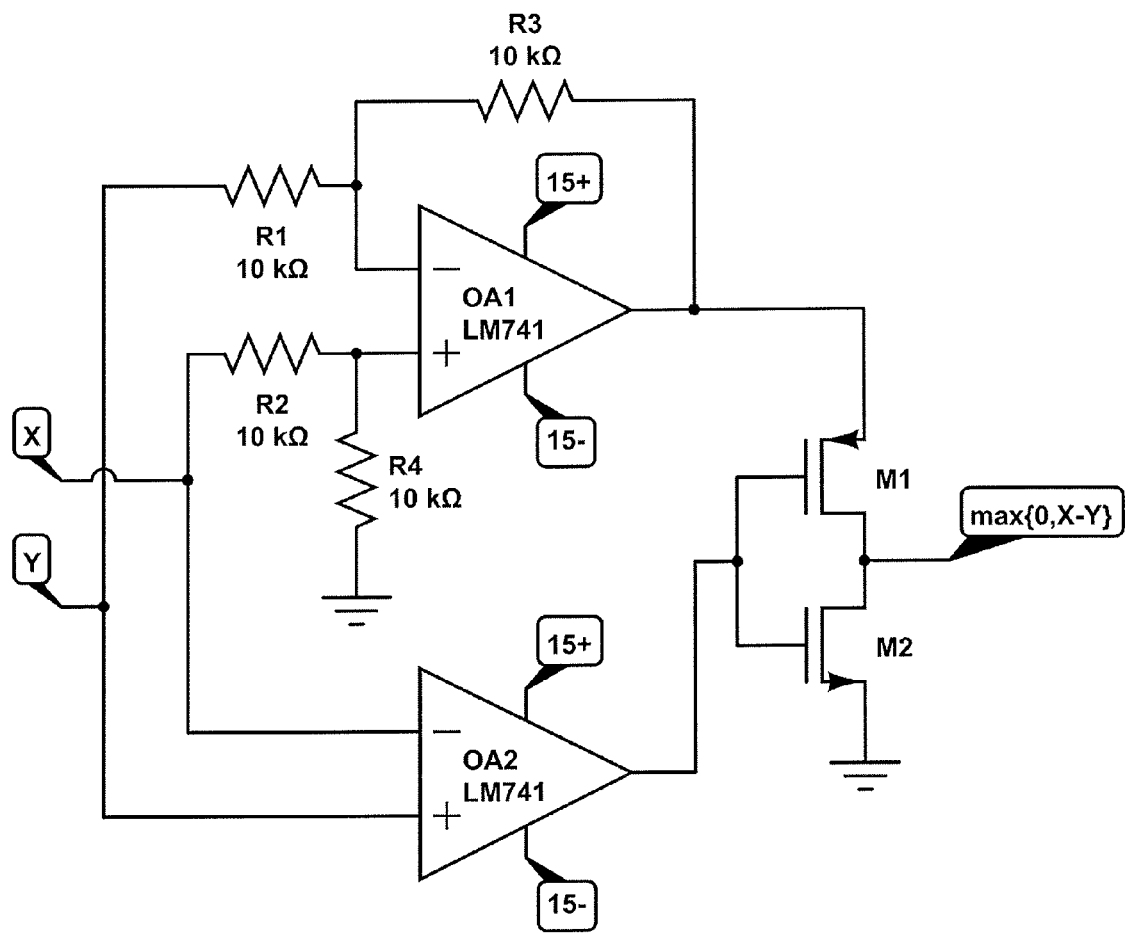
FIG. 7 is a circuit diagram for another linear AND-NOT gate with two op amps.

FIG. 7 is a circuit diagram for another linear AND-NOT gate with two op amps. The first op amp is configured as a subtractor and the second as a comparator. The output is within 1 mV of linear.

Figure 8:
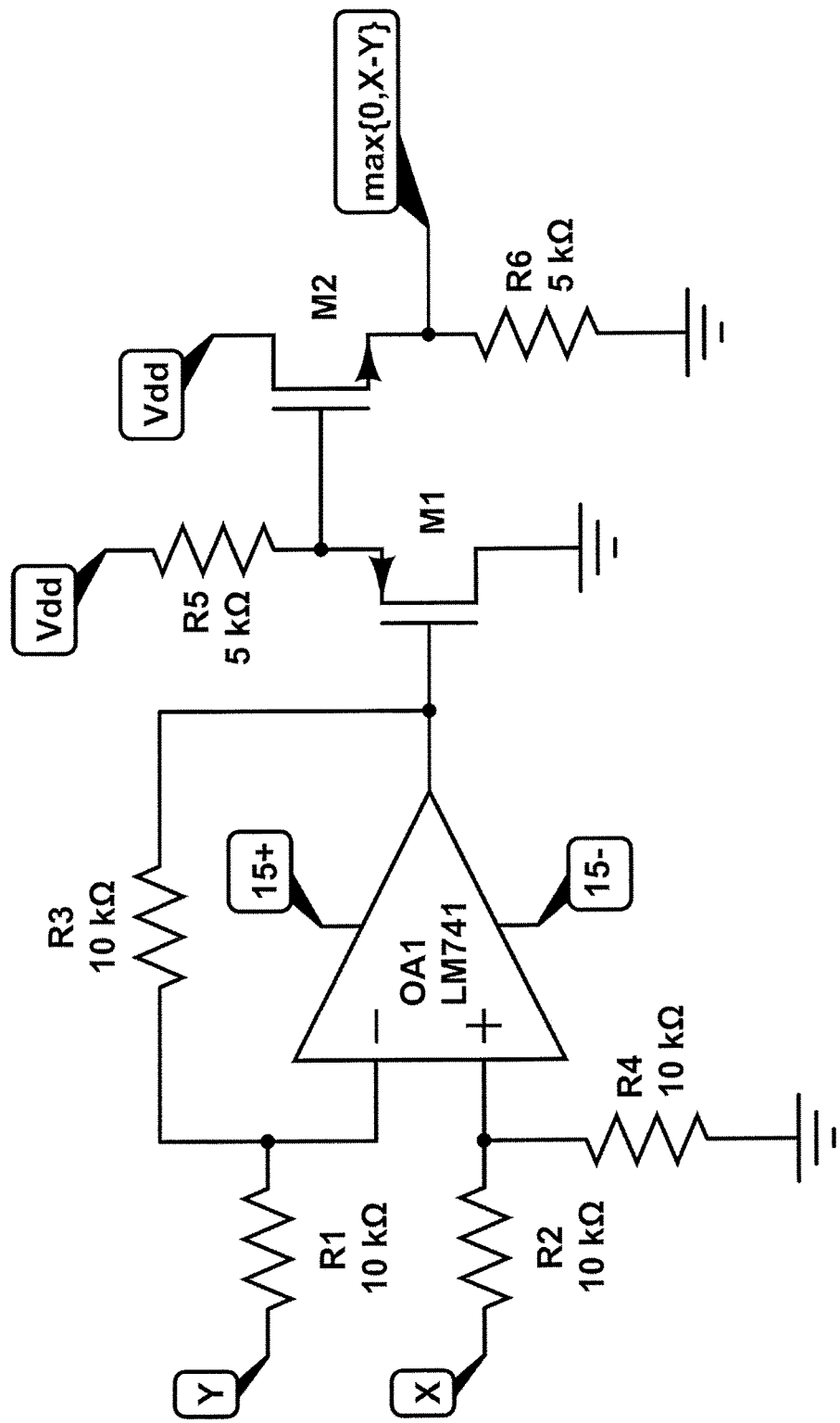
FIG. 8 is a circuit diagram for a preferred linear AND-NOT gate with an op amp and a chopper.

FIG. 8 is a circuit diagram for a preferred linear AND-NOT gate with an op amp and a chopper.

Figure 9:
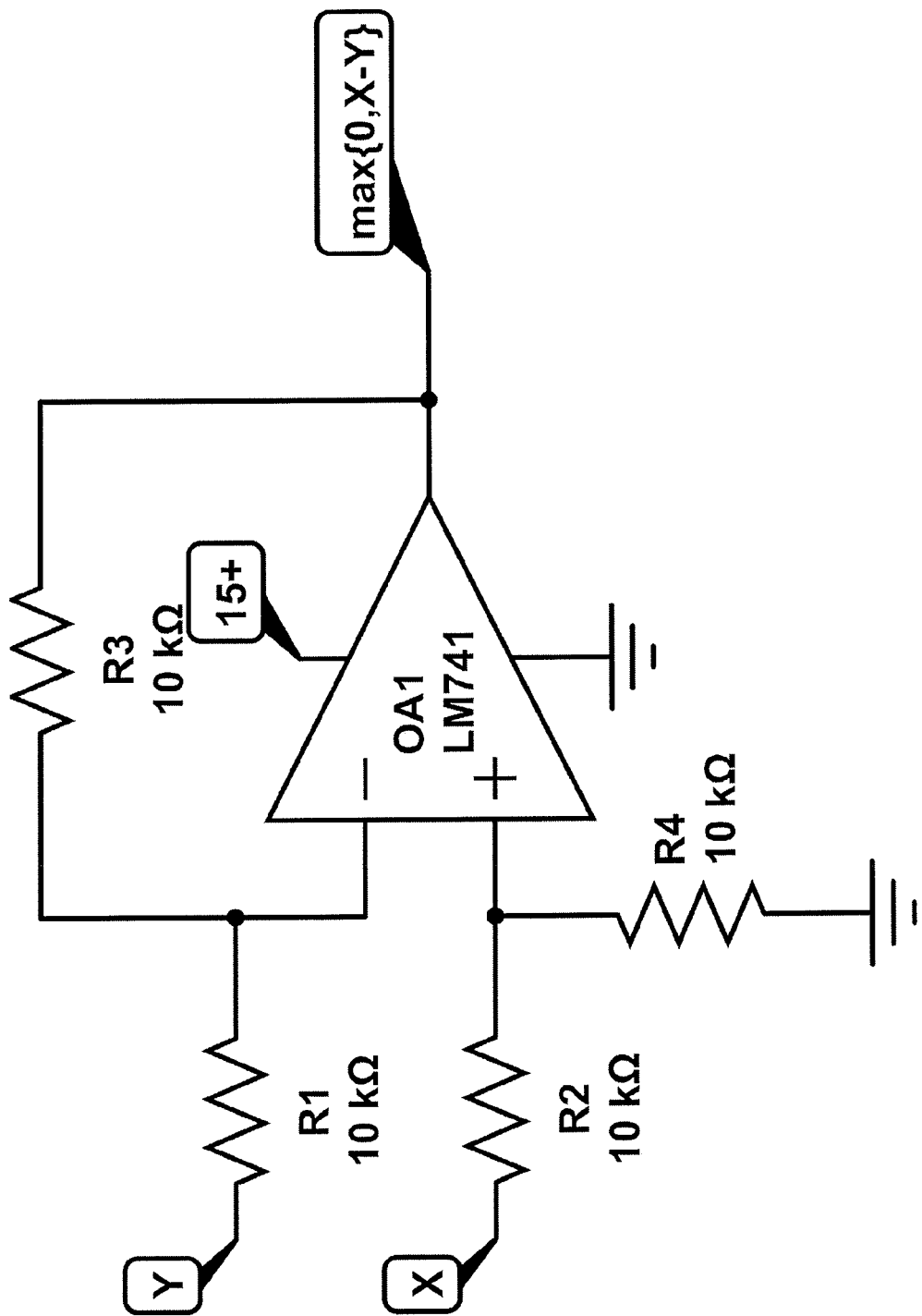
FIG. 9 is a circuit diagram for a preferred linear AND-NOT gate with one op amp.

FIG. 9 is a circuit diagram for a preferred linear AND-NOT gate implemented with a single op amp. The output is within 20 mV of linear.

Figure 10:
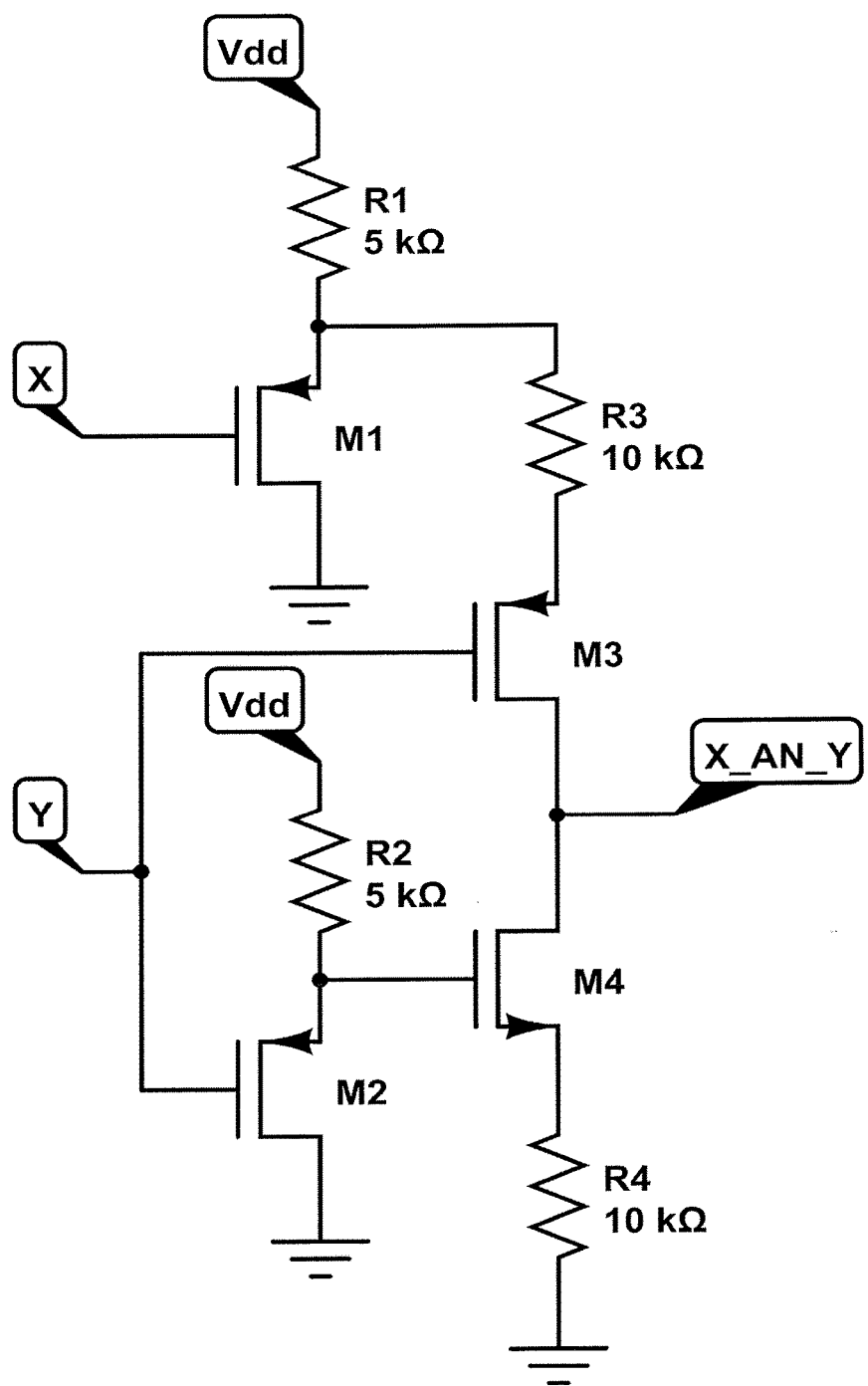
FIG. 10 is a circuit diagram for a preferred four-FET linear AND-NOT gate.
Figure 11:
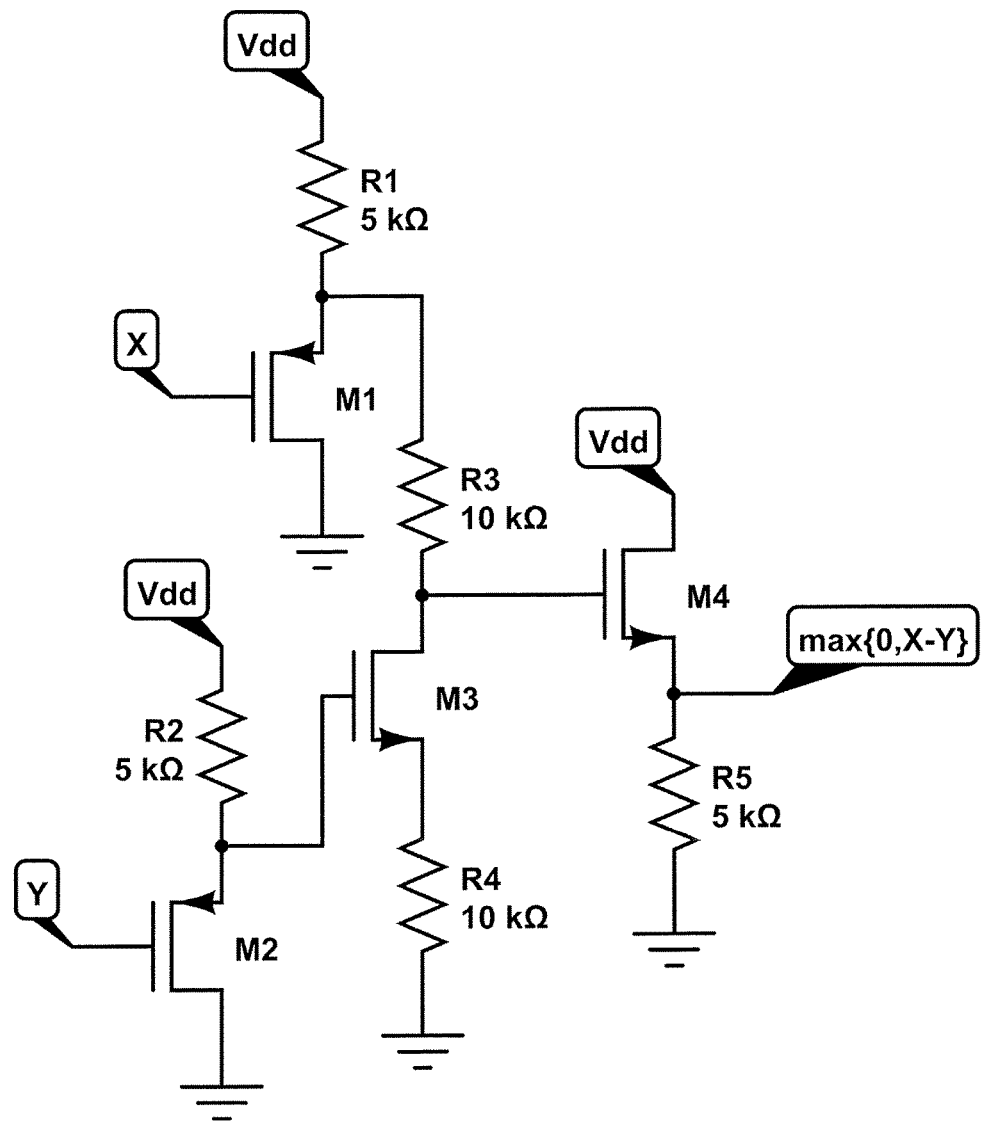
FIG. 11 is a circuit diagram for another four-FET linear AND-NOT gate.

FIGS. 10 and 11 are circuit diagrams for preferred four-FET linear AND-NOT gates.

The inputs are buffered against affects from the gate. The 4-FET gates perform as linear AND-NOT gates nearly as well as the op amp gates of FIGS. 6-9. The largest error is less than 20 mv, and for most inputs the error is less than 2 mV. Linearity is achieved by modifying the FETs' thresholds. With further adjustment, the circuit can function as a subtractor (described below).

Figure 12:
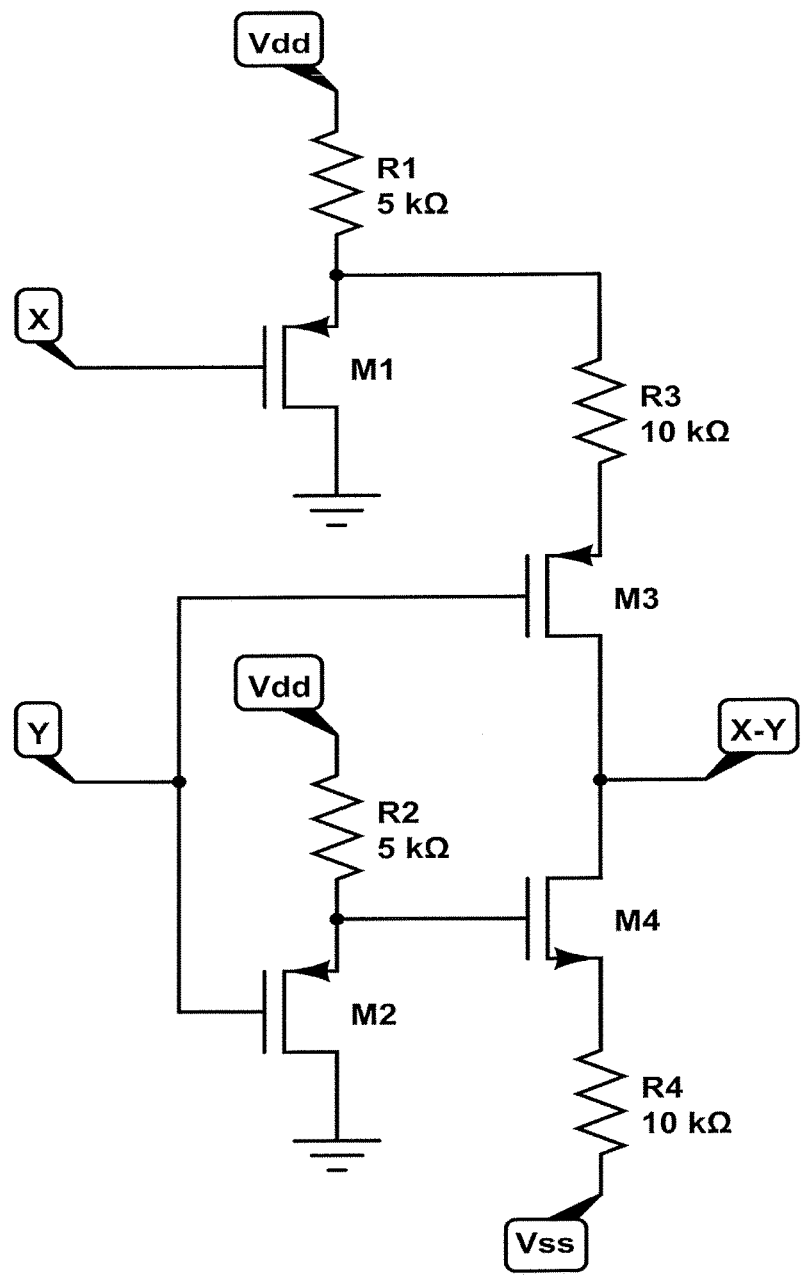
FIG. 12 is a circuit diagram for a preferred subtractor circuit.

For the AND-NOT gate circuit designs employing two op amps of which one is a subtractor, FIG. 12 shows a preferred subtractor circuit comprising three P-channel MOSFET transistors, one N-channel MOSFET transistor, and four resistors. The thresholds of the first, second, and third P-channel transistors are set by bias voltages Vdd. The threshold of the N-channel transistor M4 is set by bias voltage Vss. The first input X is coupled to the gate of the first P-channel transistor M1, and the second input Y is coupled to the gates of the second and third P-channel transistors M2 and M3. The source of the first P-channel transistor is coupled to a positive supply voltage of Vdd volts across a 5 k ohm resistor R1 and to the source of the second P-channel transistor M3 across a 10 k ohm resistor R3. The source of the third P-channel transistor is coupled to the Vdd supply voltage across a 5 k ohm resistor R2 and to the gate of the N-channel transistor M4. The source of the N-channel transistor is coupled to a negative supply voltage of Vss volts across a 10 k ohm resistor R4. The drains of the first and third P-channel transistor are coupled to ground. The drains of the second P-channel transistor and the N-channel transistor are coupled to the output. This configuration for the voltage subtractor does not depend on a differential pair of amplifiers.

Using AND-NOT Gates in Fast Fuzzy Decoder Architecture

Table I is a chart comparing logic identities for constructing a Fast Fuzzy Decoder (FFD) using AND-NOT gates with the interval measured by the FFD output and the approximate value of the FFD output. The Boolean logic identities in the first column equate every conjunction to a conjunction A AND-NOT B. The recursive and reductive identities show how logic circuits can be implemented with AND-NOT gates. If the gates satisfy the fuzzy properties a, b, and c, the second column shows the interval measured by the corresponding FFD output. The third column shows the approximate value of the response is the length of the interval. The notation ||b−a|| stands for the length of the interval [a, b] if a<b, and 0 otherwise. The accuracy of the approximation depends on the degree of nonlinearity in the component AND NOT gates.

The logic identities in the first column of Table I show that every conjunction is logically equivalent to a single AND-NOT conjunction A AND-NOT B. To make them clear, components A and B are enclosed in braces in the first column. These recursive and reductive identities show how decoders can be implemented entirely with AND-NOT gates. If the gates satisfy the interval measure property defined by properties a, b, and c above, the circuit can function as a Fast Fuzzy Decoder.

Figure 13:
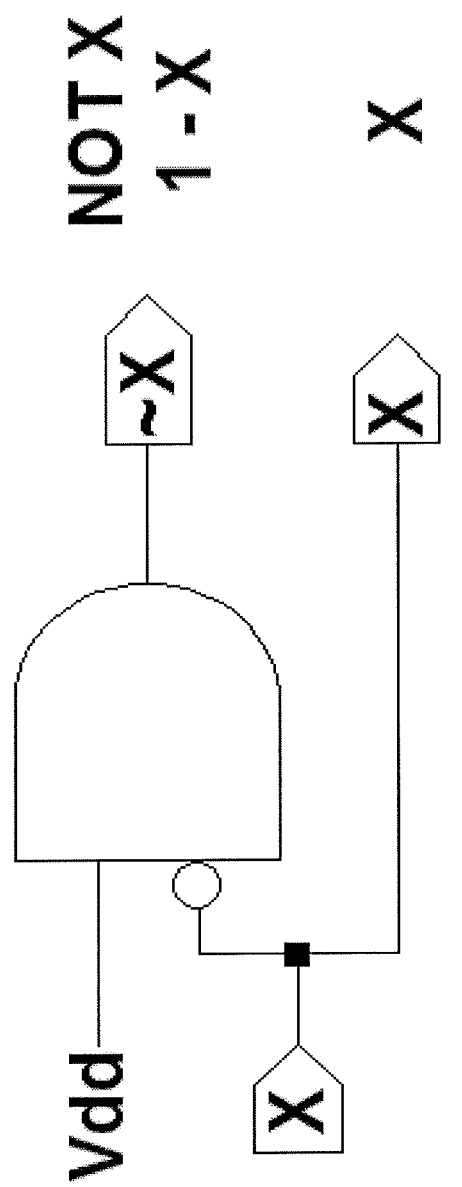
FIG. 13 is a circuit diagram for a preferred Fast Fuzzy Decoder (FFD) using an AND-NOT gate for one input X.
Figure 14:
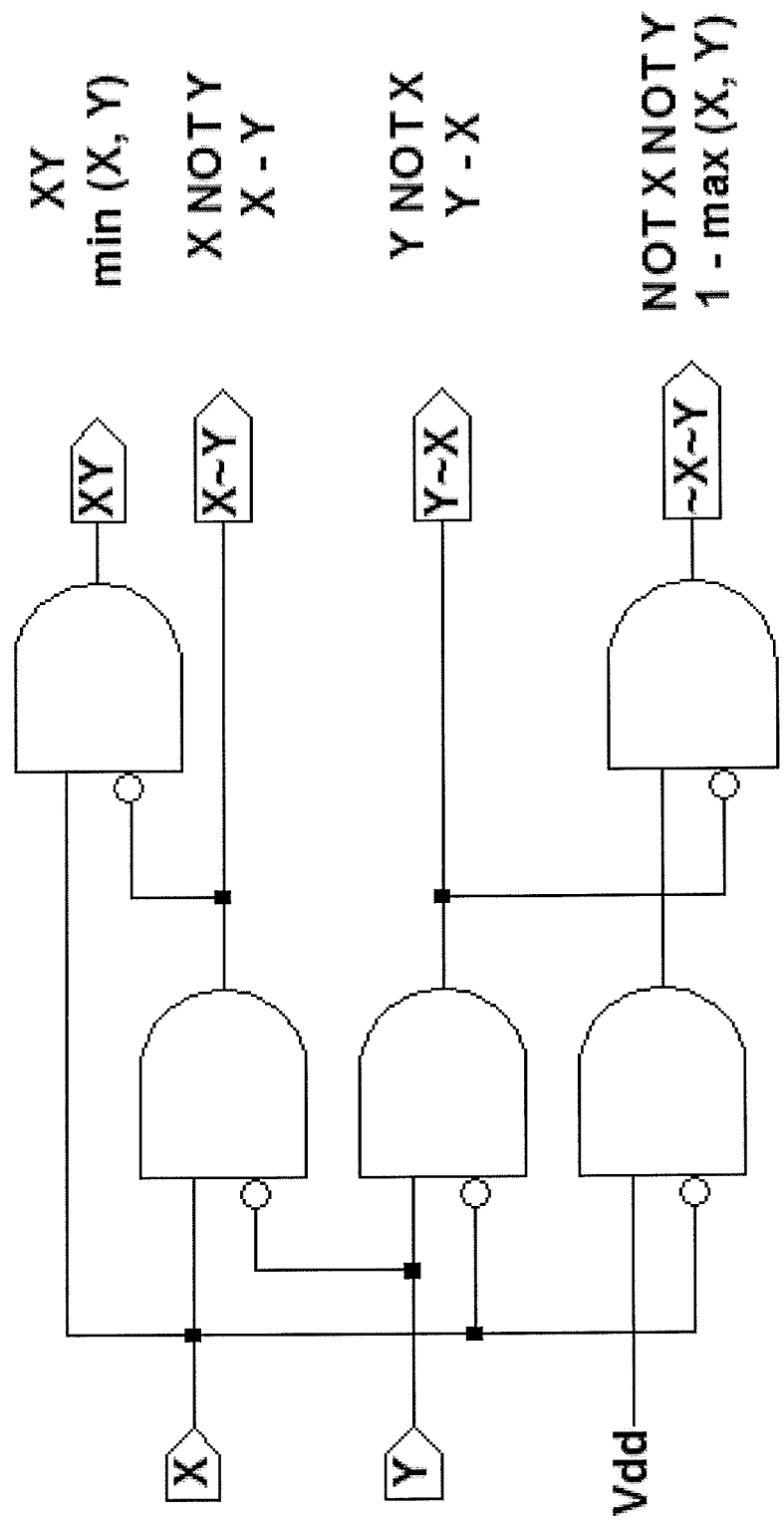
FIG. 14 is a circuit diagram for a preferred an FFD decoder using AND-NOT gates for two inputs X and Y.
Figure 15:
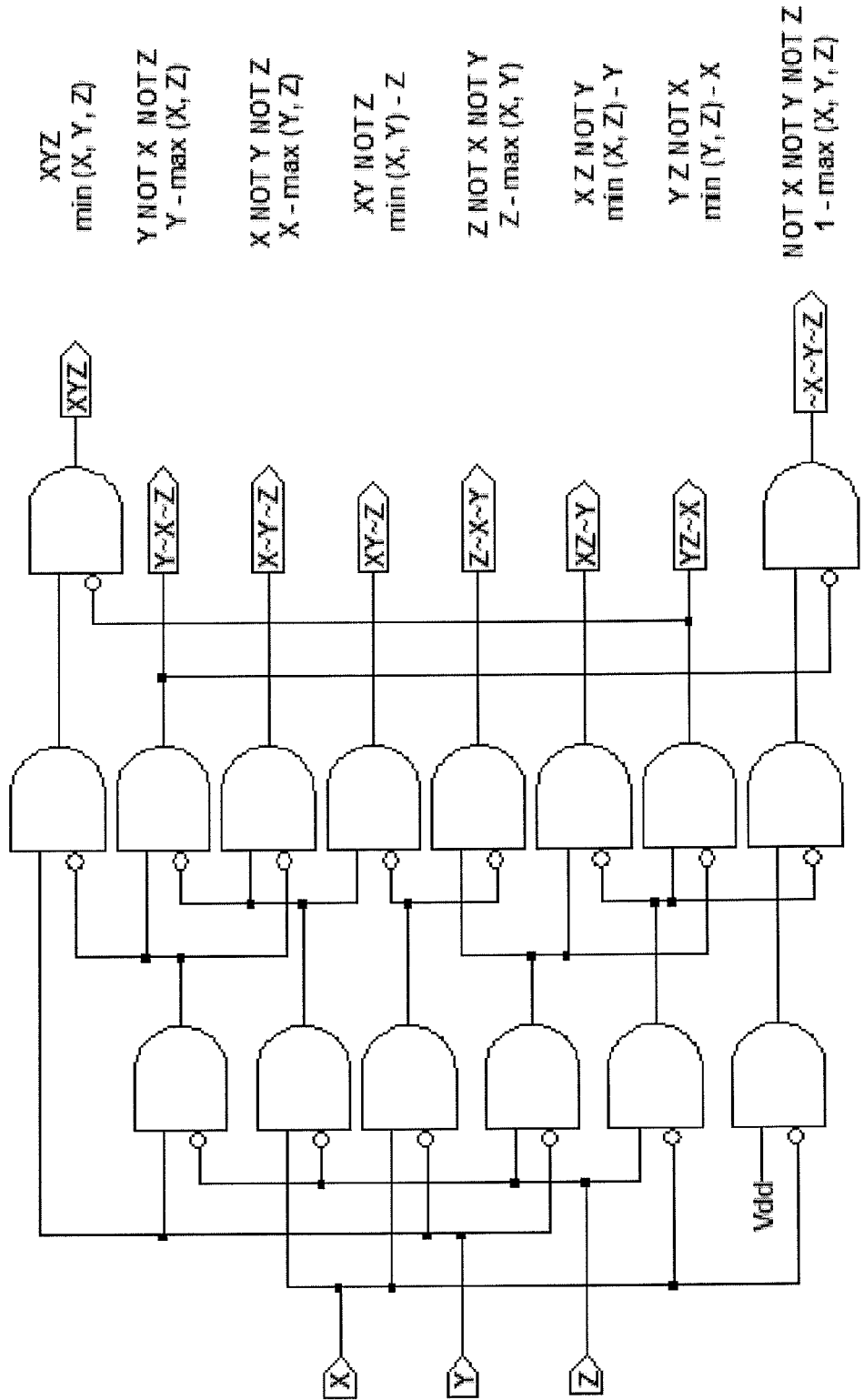
FIG. 15 is a circuit diagram for an FFD decoder using AND-NOT gates for three inputs X, Y and Z.

FIGS. 13-15 show such FFD decoders configured for one (X), two (X-Y), and three (X-Y-Z) inputs, respectively. In FIG. 13, an X input is applied to an AND-NOT gate and can derive NOT-X and X outputs. In FIG. 14, X and Y inputs are applied to a network of AND-NOT gates and can derive XY, X-NOT-Y, Y-NOT-X and NOT-X-NOT-Y outputs. In FIG. 15, X, Y and Z inputs are applied to a network of AND-NOT gates and can derive XYZ, Y-NOT-X-NOT-Z, X-NOT-Y-NOT-Z, XY-NOT-Z, Z-NOT-X-NOT-Y, XZ-NOT-Y, YZ-NOT-X, and NOT-X-NOT-Y-NOT-Z outputs. If the component AND-NOT gates satisfy the interval measure property defined in a, b, and c above, the decoders produce fuzzy truth values and are called Fast Fuzzy Decoders (FFDs). For n inputs, n>3, the most efficient FFD architecture is defined recursively in terms of two FFDs, each with n−1 inputs. If the n inputs are X1, . . . , Xn, the inputs to the first FFD are X1 AND-NOT Xn AND X2 AND-NOT Xn AND . . . AND Xn−1 AND-NOT Xn, and the inputs to the second are Xn AND-NOT X1 AND Xn AND-NOT X2 AND . . . AND Xn AND-NOT Xn−1. A more detailed discussion of this recursive FFD architecture is discussed in Yoder, L. (2010) "Explicit Logic Circuits Predict Local Properties of the Neocortex's Physiology and Anatomy", PLoS ONE 5(2): e9227. doi:10.1371/journal.pone.0009227.

For FFDs composed to simulate neurons in the three-dimensional neocortex, the above-described FFD architecture was shown to be optimal in the total cost of the number of AND-NOT gates, connection length, and component packing density. For AND-NOT gates arranged on standard two-dimensional printed circuit boards, the optimal connection length and packing density cannot quite be achieved, but these cost functions are still reasonably efficient as can be seen in the figures.

The FFD output representing the fuzzy truth value of the proposition in the first column of Table I is a measure of the interval in the second column. This property follows from the FFD architecture defined by the identities in the first column and the interval measure provided by each AND NOT gate. It will be referred to here as the FFD interval measure property. This property says that the set of FFD outputs that have positive values uniquely identifies the order of the input values, and those positive output values are measures of the intervals determined by the inputs. If the component AND-NOT gates are linear, the FFD outputs are the lengths of the intervals and the sum of the outputs is 1. Most of the FFD advantages (described below) are due to the interval measure property.

Three design choices determine the FFDs' fuzzy logic: AND-NOT gates as components, a measure of the inputs' difference as the gates' fuzzy truth function, and the logic identities (Table I) that define the FFD architecture. These choices combine to produce a fuzzy logic with several desirable characteristics that are independent of the materials used (e.g., neurons or transistors), the representations of truth values (e.g., digital or analog), and the method of implementation (e.g., hardware or software). The FFD architecture using AND-NOT gates has the following advantages.

1. The FFD inputs partition the interval [0, 1] into subintervals. By the FFD interval measure property, the FFD outputs are measures of the subintervals. Because this implies the sum of the FFD outputs is approximately 1, the outputs provide a fuzzy measure of the set of standard products of the inputs. That is, the truth values are distributed over the possible conjunctions like probabilities. This allows the outputs to identify the individual components and their relative strengths in mixed input patterns, such as the sensory receptor signals produced by mixtures of colors or odorants.

2. The FFD interval measure property also implies that the combination of outputs that have positive values uniquely identifies the ordering of the input values, including equal input values. This identification of the input ordering is unambiguous in the sense that it is independent of the output values' magnitudes. This allows, among other things, not only identification of patterns but also combinations of patterns, e.g., mixtures of colors or mixtures of odorants identified from the patterns of inputs from sensory receptors independently of the intensity or concentration of the stimulus.

3. The FDD outputs retain all of the information contained in the inputs, even if the component AND NOT gates are nonlinear. The input values could even be reconstructed from the outputs.

4. Nonlinearities in the component AND NOT gates do not have serious adverse effects on the functionality of the system's fuzzy logic. Because of the inherent nonlinearity of fuzzy logic, the actual interval length shown in Table 1 for the truth value is not necessary to generate useful fuzzy logic. Useful fuzzy logic follows from the FFD interval measure property, which implies that as the interval length increases from 0 to 1, the FFD output's measure of it also increases from 0 to 1.

5. Research evidence suggests the brain does much of its information processing in a manner closely similar to FFDs.

The FFD architecture also has practical advantages in making implementation in hardware efficient in material, energy, and manufacturing costs.

1. The only hardware requirement is an AND-NOT gate whose output provides a measure of the interval defined by a first and second input value.

2. Requiring only a measure, rather than the length, of the interval between the AND NOT gate inputs allows the gate to be quite simple and to take advantage of transistors' analog characteristics. The simplicity is illustrated in the minimal designs in FIGS. 2A, 2B, 3 and 4, for example.

3. Although the number of outputs grows exponentially with the number of inputs ($2^n$ outputs for n inputs), fewer than five AND-NOT gates are required per output, regardless of the number of inputs.

4. The previous property shows that for more than a few inputs, FFD architecture can even produce Boolean logic with fewer components than conventional decoders, whose component requirement per output increases without bound as the number of inputs increases.

5. FFD architecture is modular and recursive, with each module consisting of a simple combination of a few repeated parts from the previous stage.

The FFD architecture is also computationally efficient by several measures.

1. Fuzzy AND-NOT gates achieve both high computational speed and minimal hardware requirements by using the variable voltage values of the inputs and outputs to represent fuzzy truth values. A gate made up of only a few components can provide an output voltage that is a measure of the difference between the input voltages. Digital subtraction in hardware requires many more components and correspondingly more computation time. Digital subtraction in software requires even more time. It should be noted that FFDs composed of fuzzy AND-NOT gates implemented digitally in hardware would still produce fuzzy logic more efficiently than conventional fuzzy logic computation for the other reasons given here.

2. The FFD organization of connections is also efficient. Due to parallel processing and each AND-NOT gate contributing to several outputs, FFDs produce fuzzy logic far more efficiently than conventional computational methods can achieve. The number of outputs grows exponentially with the number of inputs ($2^n$ outputs for n inputs), but the time required to compute the output values grows linearly. The total computation time for all 2n outputs is only the time it takes for a signal to pass through n−1 AND-NOT gates. For fuzzy logic with truth values represented digitally, each output would require far more computation time than this whether performed in hardware or software. For computations performed sequentially, the total computation time grows exponentially with the number of inputs.

Existing logic circuit designs can also be improved with AND-NOT gates. The NAND and NOR gates customarily used in circuit design can be replaced by AND-NOT gates. As illustrated by the master-slave flip flop circuit in FIG. 3, this can reduce material requirements in existing digital designs by half or more, depending on the designs of the original and replacement gates. De Morgan's law and logic identity 4 of the Table show how an n-input NOR gate can be constructed with AND NOT gates. Two- and three-input NOR gates constructed according to this plan are illustrated by the last outputs in FIGS. 14 and 15. For Boolean logic, a NOR gate can be constructed with fewer AND-NOT gates. The logic identity NOT X1 AND NOT X2={1 AND NOT X1} AND NOT X2 shows that a two-input NOR gate can be constructed with two AND-NOT gates. By induction, the logic identity NOT X1 AND NOT X2 . . . AND NOT Xn={NOT X1 AND NOT X2 . . . AND NOT Xn−1} AND NOT Xn shows that an n-input NOR gate can be constructed with n AND-NOT gates. So direct substitution can convert existing designs consisting of NOR gates to AND-NOT gate designs.

A NAND gate can be constructed by negating the output of an AND gate with an AND-NOT gate that has its first input from the power supply. Logic identity 3 of Table I shows how to construct an AND gate with AND-NOT gates. As with the NOR gate, a Boolean NAND gate can be constructed with fewer AND-NOT gates than by using a logic identity as in Table I.

A more efficient way to convert a design consisting of NAND gates is first to convert as many gates as possible to NOR gates and then convert them to AND-NOT gates as described above. This can be accomplished by moving the inverter at the output of each NAND gate to the input of the next gate. This converts each NAND gate to a NOR gate except for the gates at the inputs and outputs, which become AND and OR gates, respectively. Each AND gate can be efficiently converted to AND-NOT gates by the identity X1 AND . . . AND Xn={X1 AND . . . AND Xn−1} AND-NOT {(X1 AND . . . AND Xn−1) AND-NOT Xn}. Each OR gate can be converted by negating a NOR gate with an AND-NOT gate: X1 OR . . . OR Xn=1 AND {NOT X1 AND-NOT X2 . . . AND-NOT Xn}.

Any Boolean switching function can be converted to a fuzzy circuit with two FFDs. (Note that if the inputs are Boolean, the output of the fuzzy circuit will be the same as the original Boolean function.) Any switching function can be expressed as a standard sum of products. An FFD produces all of the products of the inputs. The whole FFD may not be needed: just the part that produces the particular products in the sum of products is sufficient. Feeding these outputs as inputs to a second FFD will provide the desired sum of products. For a set of truth values {Xi}, a standard definition for fuzzy OR is max {Xi}. For an FFD with inputs {Xi}, one of the outputs is a measure of 1−max{Xi}. As with the first FFD, just the part of the second FFD that produces the single output 1−max{Xi} is sufficient. An additional subtraction with a single AND NOT gate gives a measure of 1−[1−max{Xi}]=max{Xi}. This is the fuzzy truth value of the sum of products.

Figure 16:
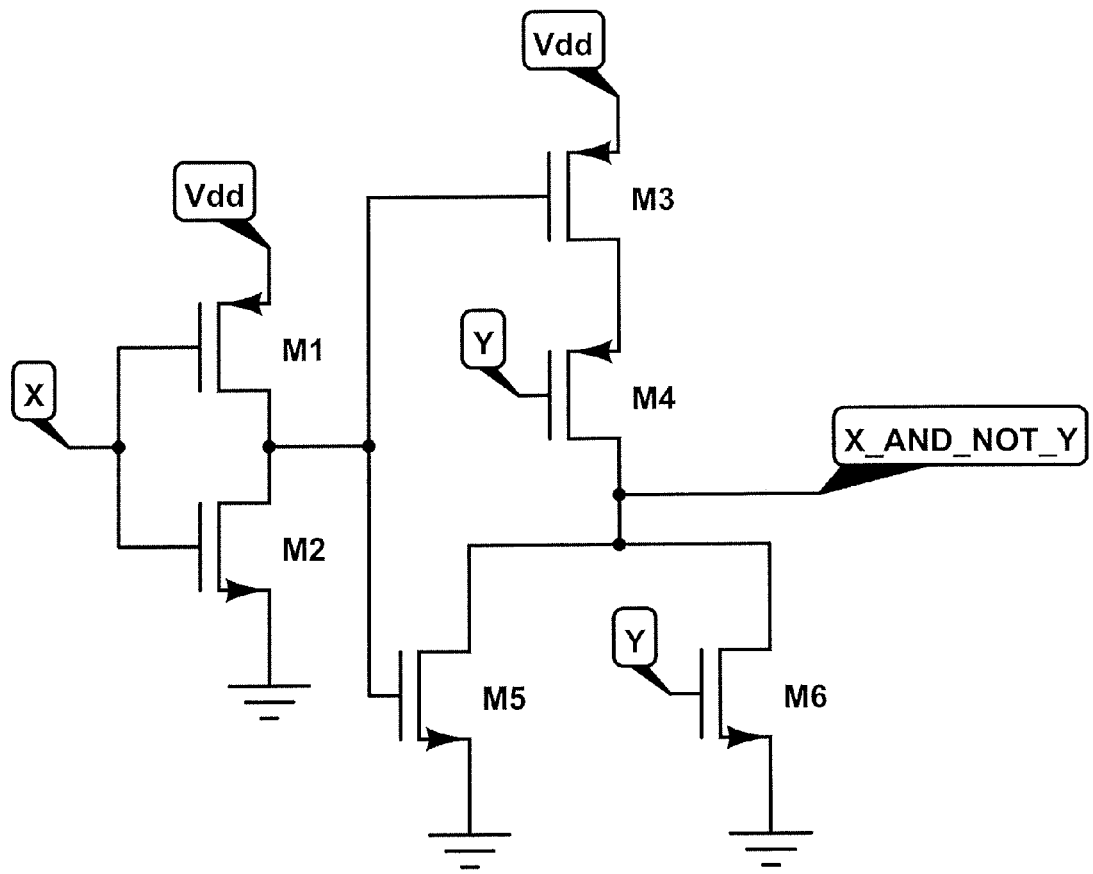
FIG. 16 shows an AND-NOT gate design using CMOS transistors.

The CMOS design in FIG. 16, employing transistors M1-M6, has all of the advantages of CMOS architecture, including no static power dissipation, no resistors, noise immunity, small size, and ease of fabrication. Like the 3-FET design in FIG. 4, it gives the correct high or low output over a wide range of inputs. When used in FFD architecture, the CMOS AND-NOT gate makes an efficient digital decoder. With the decoder's material requirements bounded at less than five AND-NOT gates per output, the improvement over standard digital decoder designs increases with the number of inputs. For any digital circuit made up of CMOS AND-NOT gates, the material requirements can be reduced by suitable placement of the gates' inverters. The architecture of FIG. 16 requires inversion of the X input to the X AND-NOT Y gate. For a gate whose output provides the X input to more than one gate, the output can be inverted before separating to the receiving gates. This eliminates the need for a separate inverter at each receiving gate. If the gate's output provides only X input to other gates, the gate's inverted output NOT(X AND NOT Y) can be accomplished by inverting the second (Y) input to a standard CMOS NAND gate, with no inversion of the X input. No inversion is necessary if the gate's output provides only Y input to other gates or is an output of the entire circuit. If a gate's output provides both X and Y inputs to other gates, two outputs are needed—one for the Y inputs and the inversion for X inputs.

Figure 17A:
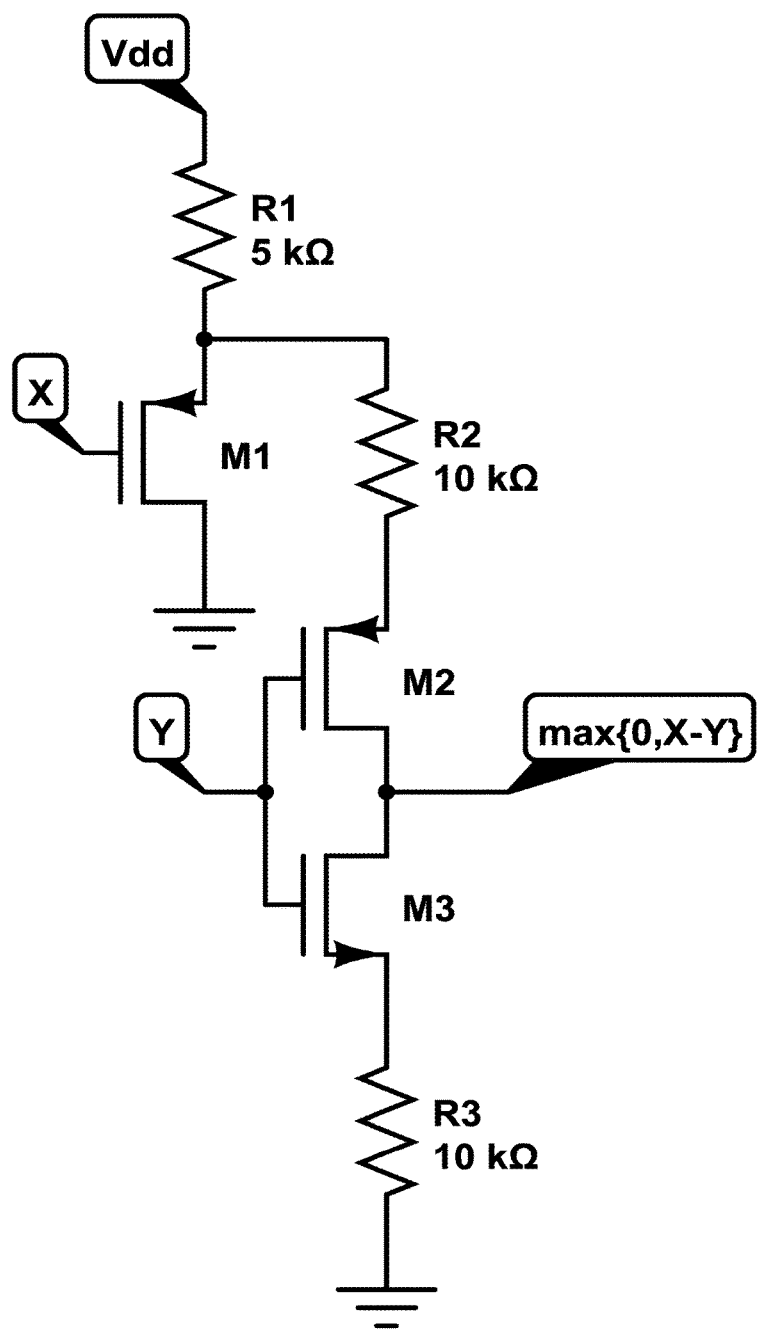
FIGS. 17A and 17B show linear AND-NOT gate designs using only 3 FETs.
Figure 17B:
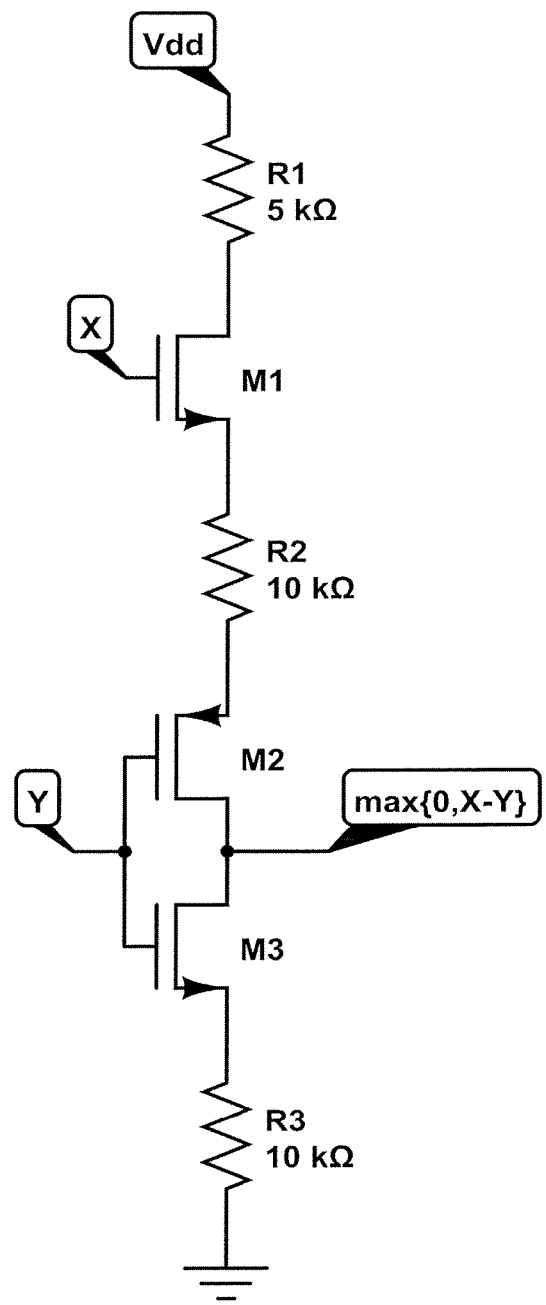

FIGS. 17A and 17B are linear AND-NOT gates with only 3 FETs. These gates generate linear output as accurately as in FIGS. 10 and 11, but with fewer components.

It is to be understood that other modifications and variations may be devised within the disclosed principles of the invention, all being within the scope of the following claims.

The invention claimed is:

1. A logic decoder circuit adapted for performing Boolean or fuzzy logic comprising: one or more logic components configured to perform a logic function of an AND-NOT gate, said AND-NOT gate comprising a circuit that performs a conjunction of a first input X and a second input Y to obtain an output X-AND-NOT-Y that is either Boolean or substantially linear for given ranges for X and Y ($\max\{0, X-Y\}$), wherein said AND-NOT gate is used in a fast fuzzy decoder.

2. A logic decoder circuit according to claim 1, wherein said AND-NOT gate is configured to emulate the function of a neuron, so that fuzzy logic decoders composed of said AND-NOT gates can closely emulate the brain's method of processing information.

3. A logic decoder circuit according to claim 1, wherein said AND-NOT gate has an X input applied to a high end of resistor, a Y input applied to a gate of N-channel transistor having its source connected in series with the resistor and its drain to ground, and the output X-AND-NOT-Y provided at the connection between resistor and transistor.

4. A logic decoder circuit according to claim 1, wherein said AND-NOT gate has an X input applied to a source of a P-channel transistor, a Y input applied to a gate of the transistor, the drain of the transistor connected in series through the resistor to ground, and the output X-AND-NOT-Y provided at the connection between resistor and transistor.

5. A logic decoder circuit according to claim 1, wherein said AND-NOT gate is used in a master-slave flip flop circuit.

6. A logic decoder circuit according to claim 1, wherein said AND-NOT gate is composed of two operational amplifier circuits.

7. A logic decoder circuit according to claim 1, wherein said AND-NOT gate is composed of an operational amplifier and a chopper.

8. A logic decoder circuit according to claim 1, wherein said AND-NOT gate is composed of a single operational amplifier.

9. A logic decoder circuit according to claim 1, comprising FET transistors forming a linear AND-NOT gate.

10. A logic decoder circuit according to claim 1, comprising CMOS transistors forming the AND-NOT gate.

11. A logic decoder circuit according to claim 1, wherein said AND-NOT gate is used to replace a NAND or a NOR gate in conventional digital logic circuit architecture.

12. A logic decoder circuit according to claim 1, wherein said AND-NOT gate is used to change a digital logic circuit to a fuzzy logic circuit.

13. A logic decoder circuit according to claim 1, wherein said AND-NOT gate is used in a digital subtractor circuit.

14. A logic decoder circuit adapted for performing Boolean logic comprising:
one or more logic components configured to perform a logic function of an AND-NOT gate, said AND-NOT gate comprising a circuit that performs a conjunction of an excitatory input X and an inhibitory input Y to obtain a Boolean output X-AND-NOT-Y for given ranges for X and Y,
wherein said AND-NOT gate has an X input applied to a source of a first P-channel transistor connected to a second N-channel transistor to ground, a Y input applied in parallel to the gates of both transistors, and the output X-AND-NOT-Y provided at the connection between the first and second transistors.

15. A logic decoder circuit adapted for performing Boolean logic comprising:
one or more logic components configured to perform a logic function of an AND-NOT gate, said AND-NOT gate comprising a circuit that performs a conjunction of an excitatory input X and an inhibitory input Y to obtain a Boolean output X-AND-NOT-Y for given ranges for X and Y,
wherein said AND-NOT gate has an X input applied to a gate of a first P-channel transistor in a first stage connected in series with a first resistor to ground and biased by bias voltage Vdd, the first stage output connected to a gate of a second P-channel transistor in a second stage connected in series with a third P-channel transistor and biased by bias voltage Vdd, a Y input applied to a gate of the third transistor, the drain of the third transistor connected in series through a second resistor to ground, and the output X-AND-NOT-Y provided at the connection between the second resistor and third transistor.

16. A logic decoder circuit adapted for performing Boolean or fuzzy logic comprising:
one or more logic components configured to perform a logic function of an AND-NOT gate, each AND-NOT gate comprising a circuit that performs a conjunction of an excitatory input X and an inhibitory input Y to obtain an output X-AND-NOT-Y substantially linearly for given ranges for X and Y,
wherein said AND-NOT gate is composed of two operational amplifier circuits and one operational amplifier circuit is configured as a subtractor.

17. A logic decoder circuit according to claim 16, wherein the subtractor comprises three P-channel MOSFET transistors, one N-channel MOSFET transistor, and four resistors.

18. A logic decoder circuit according to claim 16, wherein, for the subtractor, thresholds of the first, second, and third P-channel transistors are set by bias voltages Vdd, threshold of the N-channel transistor is set by bias voltages Vss, the input X is coupled to a gate of the first P-channel transistor, the input Y is coupled to gates of the second and third P-channel transistors, a source of the first P-channel transistor is coupled to a positive supply voltage of Vdd volts across a first resistor and to a source of the second P-channel transistor across a second resistor, a source of the third P-channel transistor is coupled to the Vdd voltage across a third resistor and to a gate of the N-channel transistor, a source of the N-channel transistor is coupled to a negative supply voltage of Vss volts across a fourth resistor, drains of the first and third P-channel transistor are coupled to ground, and drains of the second P-channel transistor and the N-channel transistor are coupled to the output.

19. A logic decoder circuit adapted for performing Boolean or fuzzy logic comprising:
   one or more logic components configured to perform a logic function of an AND-NOT gate, each AND-NOT gate comprising a circuit that performs a conjunction of an excitatory input X and an inhibitory input Y to obtain an output X-AND-NOT-Y substantially linearly for given ranges for X and Y,
   wherein said AND-NOT gate is composed of two operational amplifier circuits and the second operational amplifier circuit is configured as a half-wave rectifier or as a comparator.

* * * * *